US007812621B2

(12) United States Patent
Makihara et al.

(10) Patent No.: US 7,812,621 B2
(45) Date of Patent: Oct. 12, 2010

(54) MEASURING APPARATUS AND METHOD FOR MEASURING A SURFACE CAPACITANCE OF AN INSULATING FILM

(75) Inventors: Katsunori Makihara, Higashihiroshima (JP); Seiichi Miyazaki, Higashihiroshima (JP); Seiichiro Higashi, Higashihiroshima (JP)

(73) Assignee: Hiroshima University, Hiroshima (JP)

( * ) Notice: Subject to any disclaimer, the term of this patent is extended or adjusted under 35 U.S.C. 154(b) by 0 days.

(21) Appl. No.: 12/664,840

(22) PCT Filed: Jul. 31, 2008

(86) PCT No.: PCT/JP2008/002067

§ 371 (c)(1),
(2), (4) Date: Dec. 15, 2009

(87) PCT Pub. No.: WO2010/013292

PCT Pub. Date: Feb. 4, 2010

(65) Prior Publication Data

US 2010/0176824 A1   Jul. 15, 2010

(51) Int. Cl.
G01R 27/26 (2006.01)
G01R 31/26 (2006.01)
(52) U.S. Cl. ........................ 324/690; 324/765
(58) Field of Classification Search ................ 324/690
See application file for complete search history.

(56) References Cited

U.S. PATENT DOCUMENTS 6,037,781 A * 3/2000 Kono et al. ................. 324/537
7,239,152 B2 * 7/2007 Van Horn et al. ........... 324/658
7,358,748 B1 * 4/2008 Miller et al. ................ 324/716
2003/0071679 A1 * 4/2003 Kono et al. ................. 327/538
2010/0148813 A1 * 6/2010 Erickson .................... 324/758

FOREIGN PATENT DOCUMENTS

| JP | 47-024266 | 10/1972 |
| JP | 08-005642 | 1/1996 |
| JP | 2003-092319 | 3/2003 |

OTHER PUBLICATIONS

International Search Report for PCT/JP2009/002067 dated Oct. 28, 2008.

* cited by examiner

*Primary Examiner*—Jeff Natalini
(74) *Attorney, Agent, or Firm*—Foley & Lardner LLP

(57) ABSTRACT

A measuring unit applies a dc voltage causing an inversion layer to be formed on an interface between a semiconductor substrate and an insulating film to the semiconductor substrate while changing a change speed of a level of the dc voltage, and measures a current flowing through the insulating film. An arithmetic unit obtains a straight line showing a relationship between the current flowing through the insulating film and the change speed of the dc voltage on the basis of a relationship between the current measured by the measuring unit and the dc voltage, and calculates a slope of the obtained straight line as surface capacitance of the insulating film. The arithmetic unit calculates permittivity of the insulating film on the basis of the calculated surface capacitance, an area of contact between a probe and the insulating film and a thickness of the insulating film.

10 Claims, 4 Drawing Sheets

MEASURING APPARATUS AND METHOD FOR MEASURING A SURFACE CAPACITANCE OF AN INSULATING FILM

CROSS-REFERENCE TO RELATED APPLICATIONS

The present application is a U.S. national stage application claiming the benefit of International Application No. PCT/JP2008/002067, filed on Jul. 31, 2008, the entire contents of which is incorporated herein by reference in its entirety.

TECHNICAL FIELD

The present invention relates to a measuring apparatus and a measuring method measuring capacitance or permittivity.

BACKGROUND ART

An integrated multifunctional SPM sensor configured to properly and selectively perform AFM (atomic force microscope) measurement, STM (scanning tunneling microscope) measurement and SNOM (scanning near field optical microscope) measurement is usually known (Japanese Patent Laid-Open No. 8-5642).

The above integrated multifunctional SPM sensor includes a cantilever portion having a probe at a free end of the cantilever portion, a support portion supporting a base end of the cantilever portion, a first piezoresistance layer provided to the cantilever portion and connected to a dc constant voltage source through a first electrode, a second piezoresistance layer provided to the cantilever portion and connected to the dc constant voltage source through a second electrode, a first and second operational amplifiers for measuring electric currents configured to detect a change of an electric current flowing through each of the piezoresistance layers in a case where the probe scans a measurement sample, and an arithmetic circuit configured to calculate and output surface data of the measurement sample on the basis of the change of the current detected by the first and second operational amplifiers.

DISCLOSURE OF INVENTION

Problems to be Solved by the Invention

The above integrated multifunctional SPM sensor measures a degree of the bend of the cantilever portion as the change of the electric current flowing through the two piezoresistance layers, and calculates the surface data of the measurement sample on the basis of the change of the measured electric current, and thus causes a problem that it is difficult to measure surface capacitance or permittivity of the measurement sample.

Thus, it is desirable to provide a measuring apparatus measuring surface capacitance or permittivity, or a distribution thereof, of a measurement sample.

Moreover, it is desirable to provide a measuring method measuring surface capacitance or permittivity, or a distribution thereof, of a measurement sample.

Means for Solving the Problems

The present invention provides a measuring apparatus measuring surface capacitance and/or permittivity of an insulating film using a measurement sample structured such that the insulating film is formed on a semiconductor substrate.

The measuring apparatus has a measuring unit and an arithmetic unit. The measuring unit measures a current-voltage characteristic that is dependency on a dc voltage of a current flowing between a probe and the insulating film when the dc voltage is applied to the semiconductor substrate while a level of the dc voltage is being changed at a desired change speed. The dc voltage causes an inversion layer to be formed on an interface between the semiconductor substrate and the insulating film. The arithmetic unit obtains a relationship between a voltage change speed that is a change speed of the voltage applied to insulating film and a current flowing through the insulating film on the basis of the current-voltage characteristic measured by the measuring unit. The arithmetic unit calculates the surface capacitance of the insulating film on the basis of the obtained relationship.

The arithmetic unit may further obtain permittivity of the insulating film on the basis of the calculated surface capacitance, the area of the insulating film and the thickness of the insulating film.

The measurement unit may perform a measurement process measuring a plurality of current-voltage characteristics by changing the voltage change speed to a plurality of voltage change speeds. The arithmetic unit may detect a plurality of saturation currents on the basis of the measured plurality of current-voltage characteristics, plot a relationship between the detected plurality of saturation currents and the plurality of voltage change speeds to obtain a straight line showing a relationship between the current flowing through the insulating film and the voltage change speed, and calculate a slope of the obtained straight line as the surface capacitance of the insulating film.

The measuring unit may perform the measurement process at each of a plurality of positions of the insulating film being substantially flat plate-shaped. The arithmetic unit may perform the arithmetic process at each of the plurality of positions on the basis of the measured plurality of current-voltage characteristics, and may obtain a distribution of the surface capacitance of the insulating film on the plurality of positions.

Moreover, the arithmetic unit may further obtain a distribution of the permittivity of the insulating film on the basis of the distribution of the surface capacitance of the insulating film, the area of the insulating film and the thickness of the insulating film.

The present invention provides a measuring method measuring surface capacitance and/or permittivity of an insulating film of a measurement sample structured such that the insulating film is formed on a semiconductor substrate. The measuring method includes a first step of measuring, by a measuring unit, a current-voltage characteristic. The current-voltage characteristic is dependency on a dc voltage of a current flowing between a probe and the insulating film when the dc voltage is applied to the semiconductor substrate while a level of the dc voltage being changed at a desired change speed. The dc voltage causes an inversion layer to be formed on an interface between the semiconductor substrate and the insulating film. The measuring method includes a second step of detecting, by an arithmetic unit, a saturation current of the current flowing through the insulating film on the basis of the current-voltage characteristic measured at the first step. The measuring method includes a third step of obtaining, by the arithmetic unit, a relationship between the current flowing through the insulating film and a voltage change speed that is a change speed of the voltage applied to the insulating film on the basis of the saturation current detected at the second step and the voltage change speed. The measuring method includes a fourth step of calculating, by the arithmetic unit, the surface capacitance of the insulating film on the basis of the relationship obtained at the third step.

The measuring method may include a fifth step of calculating, by the arithmetic unit, the permittivity of the insulating film on the basis of the surface capacitance calculated at the fourth step, an area of the insulating film and a thickness of the insulating film.

The measuring unit may perform a measurement process for measuring a plurality of the current-voltage characteristics by changing the voltage change speed to a plurality of voltage change speeds at the first step. The arithmetic unit may perform a detection process for detecting a plurality of saturation currents on the basis of the measured plurality of current-voltage characteristics at the second step. The arithmetic unit may perform a process plotting a relationship between the plurality of voltage change speeds and the plurality of voltage change speeds, and may obtain a straight line showing a relationship between the current flowing through the insulating film and the voltage change speed at the third step. The arithmetic unit may perform an arithmetic process calculating a slope of the straight line obtained at the third step as the surface capacitance of the insulating film at the fourth step.

The measuring unit may perform the measurement process at each of a plurality of positions of the insulating film being substantially flat plate-shaped at the first step. The arithmetic unit may perform the detection process at each of the plurality of positions at the second step. The arithmetic unit may perform the process obtaining the straight line at each of the plurality of positions at the third step. The arithmetic unit may perform the arithmetic process at each of the plurality of positions, and may obtain a distribution of the surface capacitance of the insulating film.

The measuring method may include a fifth step of obtaining, by the arithmetic unit, a distribution of the permittivity of the insulating film on the basis of the surface capacitance of the insulating film calculated at the fourth step, an area of the insulating film and a thickness of the insulating film.

ADVANTAGES

The measuring apparatus of the present invention applies a dc voltage that causes an inversion layer to be formed on an interface between a semiconductor substrate and an insulating film to the semiconductor substrate while changing a level of the dc voltage, and measures a current flowing through the insulating film. The measuring apparatus obtains a relationship between the measured current and a change speed of the dc voltage. The measuring apparatus obtains surface capacitance of the insulating film on the basis of the obtained relationship. The measuring apparatus obtains permittivity of the insulating film by using the obtained surface capacitance. Moreover, the measuring apparatus obtains the surface capacitance and permittivity of the insulating film at a plurality of positions of the insulating film.

Therefore, the surface capacitance or the permittivity of the measurement sample, or a distribution of the surface capacitance or permittivity of the measurement sample can be measured.

BEST MODE FOR CARRYING OUT THE INVENTION

An embodiment of the present invention will be explained in detail with reference to the drawings, wherein like numerals reference like elements, and their explanations will not be repeated.

Figure 1:
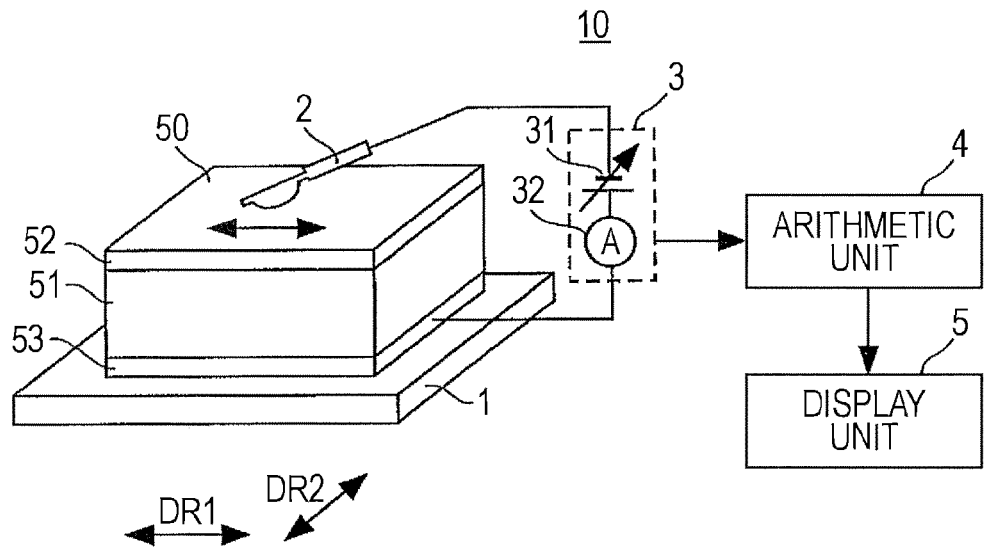
FIG. 1 is a schematic diagram showing a configuration of a measuring apparatus according to an embodiment of the present invention.

FIG. 1 is a schematic diagram showing a configuration of a measuring apparatus 10 according to the embodiment of the present invention. Referring to FIG. 1, the measuring apparatus 10 according to the embodiment of the present invention includes a stage 1, a probe 2, a measuring unit 3, an arithmetic unit 4 and a display unit 5.

A measurement sample 50 is, e.g., 2 cm wide and 2 cm long. As a result, the measurement sample 50 has an area of 4 $cm^2$. The measurement sample 50 includes a semiconductor substrate 51, an insulating film 52 and an electrode 53. The semiconductor substrate 51 is formed of, e.g., n-type silicon (n-type Si). The insulating film 52 is formed of, e.g., a $SiO_2$ film or a $Si_3N_4$ film, and is formed on the surface of the semiconductor substrate 51. The insulating film 52 is 10 nm thick. The electrode 53 is formed of, e.g., aluminum (Al), and is formed on the back surface of the semiconductor substrate 1.

The stage 1 supports the measurement sample 50. The stage 1 repeatedly moves by a certain distance in a direction DR1, which is the width direction of the measurement sample 50, and repeatedly moves by a certain distance in a direction DR2 which is vertical to the direction DR1.

The probe 2 is connected to the measuring unit 3 through a conductive wire and is arranged on the surface of the measurement sample 50.

The measuring unit 3 includes a dc voltage source 31 and an ampere meter 32. The dc voltage source 31 applies a dc voltage $V_{DC}$ that causes an inversion layer to be formed on the interface between the semiconductor substrate 51 and the insulating film 52 to the semiconductor substrate 51 of the measurement sample 50 while changing the dc voltage level at a desired speed. The ampere meter 32 measures an electric current that flows between the probe 2 and the insulating film 52 when the dc voltage $V_{DC}$ is applied to the semiconductor substrate 51.

As described above, the measuring unit 3 measures a current-voltage characteristic composed of the voltage dependency of the electric current that flows between the probe 2 and the insulating film 52 when the measuring unit 3 applies the dc voltage $V_{DC}$ that causes an inversion layer to be formed on the interface between the semiconductor substrate 51 and the insulating film 52 to the semiconductor substrate 51 of the measurement sample 50 while changing the dc voltage level at a desired speed. Then, the measuring unit 3 outputs the measured current-voltage characteristic to the arithmetic unit 4.

The arithmetic unit 4 calculates the surface capacitance $C_{SUF}$ of the insulating film 52 and permittivity $\epsilon$ of the insulating film 52 on the basis of the current-voltage characteristic received from the measuring unit 3 by using a method described later. Moreover, the arithmetic unit 4 calculates a distribution of the surface capacitance $C_{SUF}$ of the insulating film 52 and a distribution of the permittivity $\epsilon$ of the insulating film 52 on the basis of the current-voltage characteristic received from the measuring unit 3 by using a method described later. Then, the arithmetic unit 4 outputs the surface capacitance $C_{SUF}$ (or the distribution of surface capacitance $C_{SUF}$) of the insulating film 52 and the permittivity ϵ (the distribution of permittivity ϵ) of the insulating film 52 calculated above to the display unit 5.

The display unit 5 displays the surface capacitance $C_{SUF}$ (or the distribution of surface capacitance $C_{SUF}$) of the insulating film 52 and the permittivity ϵ (or the distribution of permittivity ϵ) of the insulating film 52 received from the arithmetic unit 4.

Figure 2:
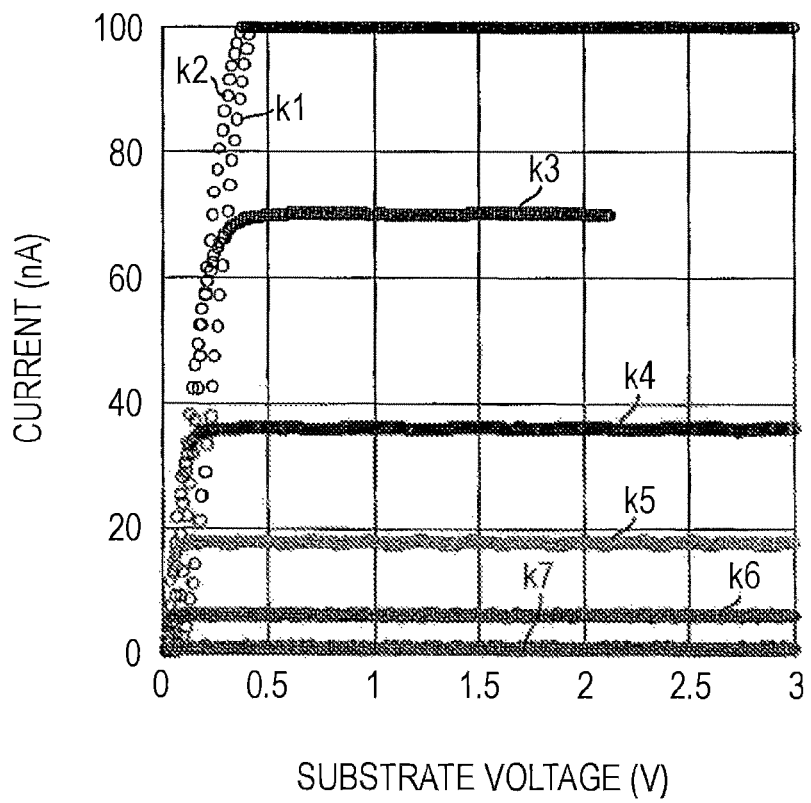
FIG. 2 shows a relationship between a current and a substrate voltage.

FIG. 2 shows a relationship between the current and the substrate voltage. In FIG. 2, the vertical axis and the horizontal axis represent the electric current that flows from the probe 2 to the insulating film 52 and the substrate voltage applied to the semiconductor substrate 51, respectively. Curves k1 to k7 represent current-voltage characteristics when a period of time for which the substrate voltage changes from 0V to 3V is 15 msec, 30 msec, 50 msec, 100 msec, 200 msec, 500 msec and 1000 msec, respectively. That is, the curves k1 to k7 represent the current-voltage characteristics when the change speed of the substrate voltage is 200V/s, 100V/s, 60V/s, 30V/s, 15V/s, 6V/s and 3V/s, respectively.

Referring to FIG. 2, when the dc voltage $V_{DC}$ is applied to the semiconductor substrate 51 of the measurement sample 50, the current that flows from the probe 2 to the insulating film 52 increases as the dc voltage $V_{DC}$ grows in a region where the level of the dc voltage $V_{DC}$ is low, and then is saturated (see the curves k1 to k7).

A method for calculating the surface capacitance $C_{SUF}$ in the arithmetic unit 4 will be explained below. If the arithmetic unit 4 receives the current-voltage characteristics represented by the curves k1 to k7 from the measuring unit 3, the arithmetic unit 4 obtains a saturation current and a change speed of the substrate voltage in each of the curves k1 to k7 on the basis of the received curves k1 to k7.

That is, the arithmetic unit 4 obtains a saturation current of 100 nA and a change speed of the substrate voltage of 200V/s on the basis of the curve k1. The arithmetic unit 4 similarly obtains 100 nA, 100V/s; 70 nA, 60V/s; 37 nA, 30V/s; 18 nA, 15V/s; 7 nA, 6V/s; and 2 nA, 3V/s on the basis of the curves k2 to k7, respectively.

Figure 3:
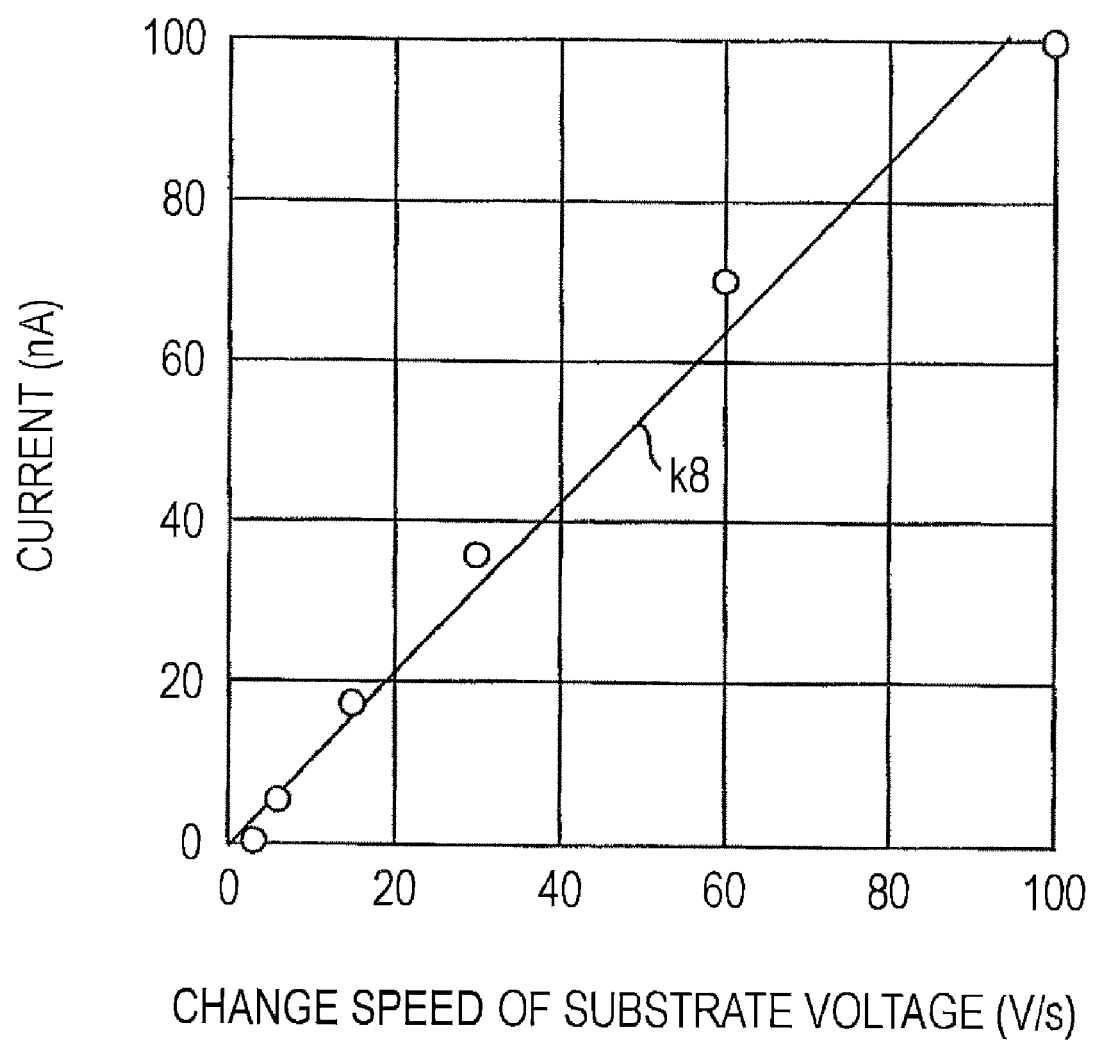
FIG. 3 shows a relationship between the current and a change rate of the substrate voltage.

FIG. 3 shows a relationship between the current and the change speed of the substrate voltage. In FIG. 3, the vertical axis and the horizontal axis represent the current that flows from the probe 2 to the insulating film 52 and the change speed of the substrate voltage applied to the semiconductor substrate 51, respectively.

The arithmetic unit 4 plots the saturation current and the change speed of the substrate voltage described above, and obtain a straight line k8 shown in FIG. 3.

Let an electric charge charged on the insulating film 52 and a voltage applied to the insulating film 52 be Q and V, respectively. Then, $Q=C_{SUF} \times V$ is satisfied. If both sides of this equation are differentiated by time, the following equation (1) is satisfied.

[EXPRESSION 1]

$$i = C_{SUF} \times (dV/dt) \quad (1)$$

The dV/dt on the right side of the equation (1) represents the change speed of the substrate voltage applied to the semiconductor substrate 51.

Therefore, upon obtaining the straight line k8 shown in FIG. 3, the arithmetic unit 4 calculates a slope of the obtained straight line k8 as the surface capacitance $C_{SUF}$ of the insulating film 52.

Let the permittivity of the insulating film 52 be ϵ, and the following equation (2) is satisfied.

[EXPRESSION 2]

$$C_{SUF} = \epsilon(S/d) \quad (2)$$

Therefore, upon calculating the surface capacitance $C_{SUF}$, the arithmetic unit 4 substitutes the calculated surface capacitance $C_{SUF}$, the thickness d=10 nm of the insulating film 52, and a contact area S between the probe 2 and the insulating film 52 (the contact area is determined by a curvature radius of a tip portion of the probe 2, and is, e.g., 20 nm) into the equation (2), and obtains the permittivity ϵ of the insulating film 52.

Figure 4:
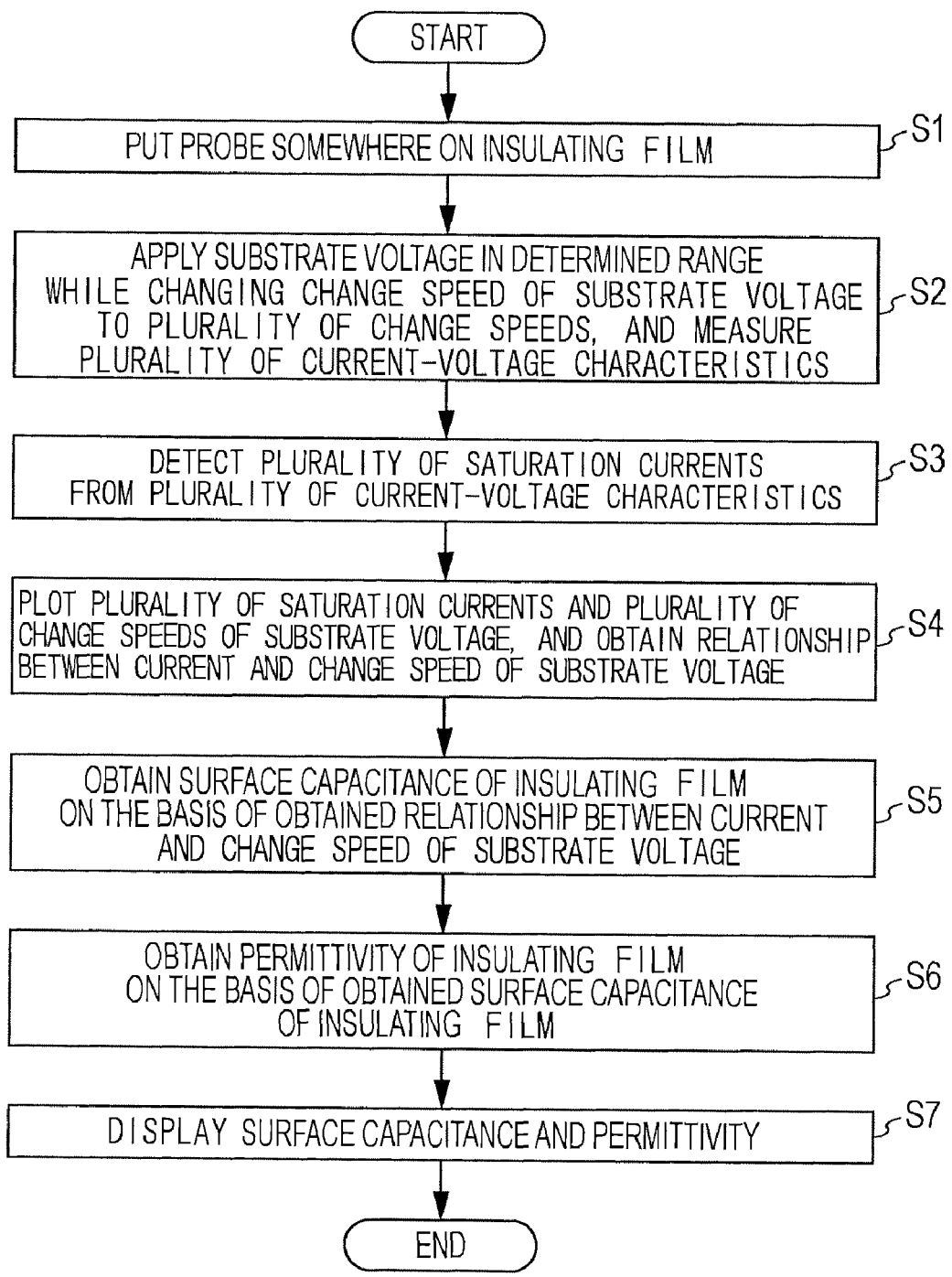
FIG. 4 is a flowchart for explaining a method for obtaining surface capacitance and permittivity.

FIG. 4 shows a flowchart explaining a method for obtaining the surface capacitance and the permittivity. Referring to FIG. 4, if a series of operations starts, the stage 1 moves in directions DR1 and DR2, and the probe 2 is put somewhere on the insulating film 52 (step S1).

Then, the measuring unit 3 applies a substrate voltage $V_{Sub}$ in a determined range to the semiconductor substrate 51 of the measurement sample 50 while changing the change speed of the substrate voltage $V_{sub}$, which causes an inversion layer to be formed on the interface between the semiconductor substrate 51 and the insulating film 52, to a plurality of change speeds, and measure a plurality of current-voltage characteristics (step S2).

After that, the arithmetic unit 4 receives the plurality of current-voltage characteristics from the measuring unit 3, and detects a plurality of saturation currents from the received plurality of current-voltage characteristics (step S3).

Thus, the arithmetic unit 4 plots the plurality of saturation currents and the plurality of change speeds of the substrate voltage $V_{sub}$, and obtains a straight line representing a relationship between the current and the change speed of the substrate voltage $V_{sub}$ (step S4). Then, the arithmetic unit 4 calculates the slope of the obtained straight line as the surface capacitance $C_{SUF}$ of the insulating film 52 (step S5).

After that, the arithmetic unit 4 substitutes the obtained surface capacitance $C_{SUF}$, the thickness of the insulating film 52 and the area of the insulating film 52 into the equation (2), and calculate the permittivity ϵ of the insulating film 52 (step S6).

Thus, the display unit 5 displays the surface capacitance $C_{SUF}$ and the permittivity ϵ calculated by the arithmetic unit 4 (step S7). Then, the series of operations ends.

Figure 5:
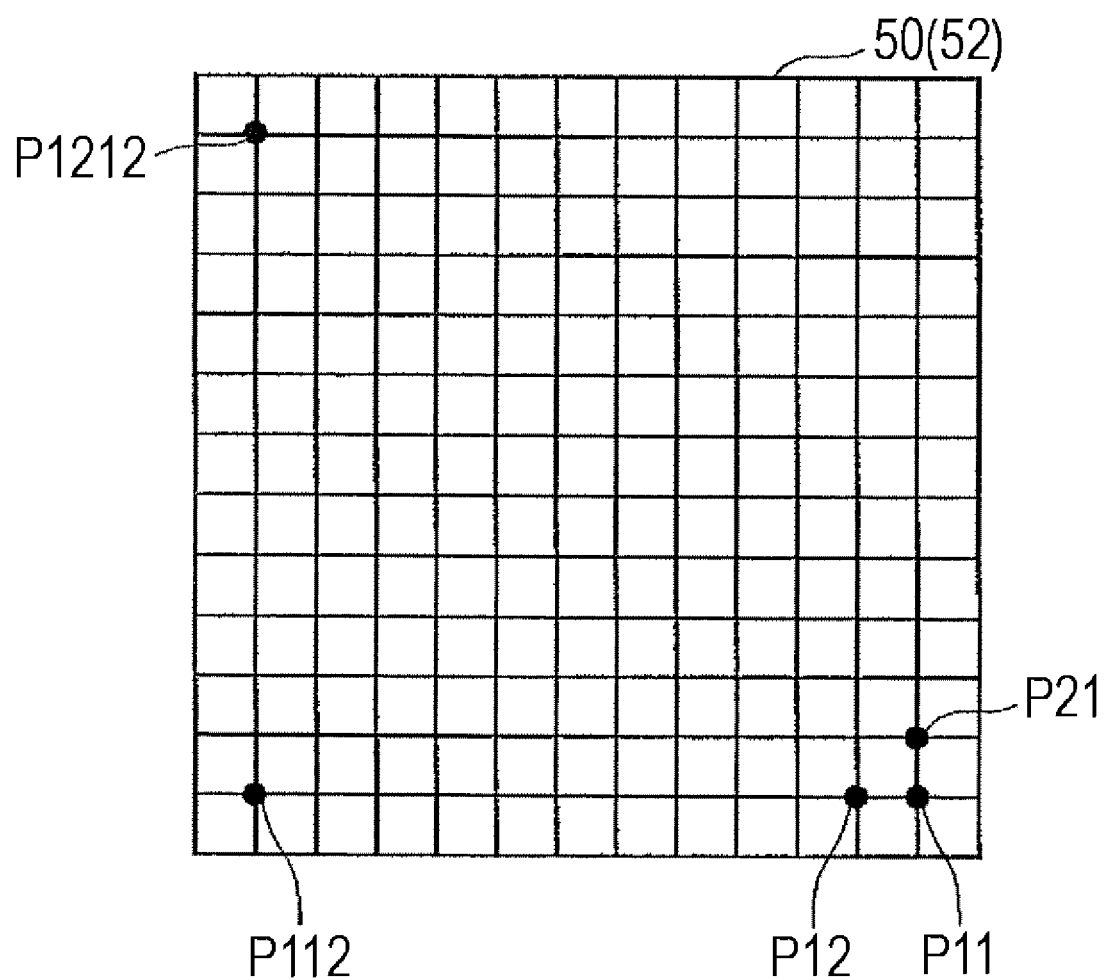
FIG. 5 is a plan view of a measurement sample shown in FIG. 1.

FIG. 5 is a plan view of the measurement sample 50. Referring to FIG. 5, the surface capacitance $C_{SUF}$ and the permittivity ϵ of the insulating film 52 may be calculated at each of the points P11 to P1212 of the insulating film 52 of the measurement sample 50 in the present invention.

In that case, the stage 1 is moved in the directions DR1 and DR2, and the probe 2 is moved to the point P11.

Then, the arithmetic unit 4 calculates the surface capacitance $C_{SUF}$ and the permittivity ϵ of the insulating film 52 at the point P11 in accordance with the flowchart shown in FIG. 4. Then, the stage 1 is moved in the directions DR1 and DR2, and the probe 2 is moved to the point P12. Then, the arithmetic unit 4 calculates the surface capacitance $C_{SUF}$ and the permittivity ϵ of the insulating film 52 at the point P12 in accordance with the flowchart shown in FIG. 4.

After that, the probe 2 is similarly moved to the points P13 to P112, P21 to P212, ..., P12 to P1212 in order, and the arithmetic unit 4 calculates the surface capacitance $C_{SUF}$ and the permittivity ∈ of the insulating film 52 at each of the above points in accordance with the flowchart shown in FIG. 4.

The arithmetic unit 4 plots on each of the points the surface capacitance $C_{SUF}$ of the insulating film 52 or the permittivity ∈ of the insulating film 52 calculated at each of the points, and obtains a distribution of the surface capacitance $C_{SUF}$ of the insulating film 52 or a distribution of the permittivity ∈ of the insulating film 52. The display unit 5 displays the distribution of the surface capacitance $C_{SUF}$ of the insulating film 52 or the distribution of the permittivity ∈ of the insulating film 52.

As described above, the measuring apparatus 10 measures a current that flows through the insulating film 52 upon applying a dc voltage, which causes an inversion layer to be formed on the interface between the semiconductor substrate 51 and the insulating film 52, to the semiconductor substrate 51 while changing the change speed of the dc voltage. The measuring apparatus 10 obtains the surface capacitance $C_{SUF}$ and the permittivity ∈ of the insulating film 52 from the relationship between the current that flows through the insulating film 52 and the change speed of the dc voltage. Moreover, the measuring apparatus 10 obtains the distribution of the surface capacitance and the distribution of the permittivity of the insulating film 52.

Therefore, the surface capacitance and the permittivity of the measurement sample, or the distributions of the surface capacitance and the permittivity can be measured.

Moreover, the surface capacitance and the permittivity of an insulating film or their distributions can be measured in the middle of actually manufacturing various kinds of devices.

As described above, the measuring apparatus 10 measures the surface capacitance and the permittivity (or the distribution of the surface capacitance and the distribution of the permittivity) of the insulating film 52. The measuring apparatus 10 is not limited to the above, and may measure only the surface capacitance of the insulating film 52, or only the permittivity of the insulating film 52, or only the distribution of the surface capacitance of the insulating film 52, or only the distribution of the permittivity of the insulating film 52.

As described above, the semiconductor substrate 51 is formed of n-type silicon. The semiconductor substrate 51 is not limited to the above, and may be formed of p-type silicon. In this case, the dc voltage source 31 of the measuring unit 3 applies a substrate voltage of −3 to 0 volts to the semiconductor substrate 51 as the dc voltage $V_{DC}$ that causes an inversion layer to be formed on the interface between the semiconductor substrate 51 and the insulating film 52.

It is intended that the embodiments disclosed in the specification be considered as exemplary only in every aspect, with a true scope of the invention being indicated by the following claims instead of the explanation of the above embodiments, and including every modification within the scope of the claims and their equivalents.

INDUSTRIAL APPLICABILITY

The present invention can be applied to a measuring apparatus measuring surface capacitance, permittivity or their distributions of a measurement sample. Moreover, the present invention can be applied to a method measuring surface capacitance, permittivity or their distributions of a measurement sample.

The invention claimed is:

1. A measuring apparatus measuring surface capacitance of an insulating film of a measurement sample structured such that the insulating film is formed on a semiconductor substrate, comprising:

a measuring unit measuring a current-voltage characteristic, which is dependency on a dc voltage of a current flowing between a probe and the insulating film, when the dc voltage is applied to the semiconductor substrate while a level of the dc voltage being changed at a desired change speed, the dc voltage causing an inversion layer to be formed on an interface between the semiconductor substrate and the insulating film; and an arithmetic unit obtaining a relationship between a voltage change speed that is a change speed of the voltage applied to insulating film and a saturation current flowing through the insulating film on the basis of the measured current-voltage characteristic, and calculating the surface capacitance of the insulating film on the basis of the obtained relationship, wherein:

the measuring unit performs a measurement process measuring a plurality of the current-voltage characteristics by changing the voltage change speed to a plurality of voltage change speeds; and the arithmetic unit detecting a plurality of saturation currents on the basis of the measured plurality of the current-voltage characteristics, plotting a relationship between the detected plurality of saturation currents and the plurality of current-voltage characteristics to obtain a straight line showing a relationship between the saturation current flowing through the insulating film and the voltage change speed, and performing an arithmetic process calculating a slope of the obtained straight line as the surface capacitance of the insulating film.

2. The measuring apparatus according to claim 1, wherein:

the measuring unit performs the measurement process at each of a plurality of positions of the insulating film being substantially flat plate-shaped, and the arithmetic unit performs the arithmetic process on each of the plurality of positions on the basis of the plurality of the measured current-voltage characteristics on the plurality of positions, and obtains a distribution of the surface capacitances of the insulating film on the plurality of positions.

3. A measuring apparatus measuring surface capacitance and permittivity of an insulating film of a measurement sample structured such that the insulating film is formed on a semiconductor substrate, comprising:

a measuring unit measuring a current-voltage characteristic, which is dependency on a dc voltage of a current flowing between a probe and the insulating film, when the dc voltage is applied to the semiconductor substrate while a level of the dc voltage being changed at a desired change speed, the dc voltage causing an inversion layer to be formed on an interface between the semiconductor substrate and the insulating film; and an arithmetic unit obtaining a relationship between a voltage change speed that is a change speed of the voltage applied to insulating film and a saturation current flowing through the insulating film on the basis of the measured current-voltage characteristic, and calculating the surface capacitance and the permittivity of the insulating film on the basis of the obtained relationship, wherein:

the measuring unit performs a measurement process measuring a plurality of the current-voltage characteristics by changing the voltage change speed to a plurality of voltage change speeds; and the arithmetic unit detects a plurality of saturation currents on the basis of the measured plurality of current-voltage characteristics, plots a relationship between the detected plurality of saturation currents and the plurality of current-voltage characteristics to obtain a straight line showing a relationship between the saturation current flowing through the insulating film and the voltage change speed, calculates a slope of the obtained straight line as the surface capacitance of the insulating film, and calculates the permittivity of the insulating film on the basis of the calculated surface capacitance, an area of the insulating film and a thickness of the insulating film.

4. The measuring apparatus according to claim 3, wherein:

the measuring unit performs the measurement process at each of a plurality of positions of the insulating film being substantially flat plate-shaped, and the arithmetic unit performs the arithmetic process on each of the plurality of positions on the basis of the measured plurality of current-voltage characteristics on the plurality of positions to obtain a distribution of the surface capacitances of the insulating film on the plurality of positions, obtains a distribution of the permittivity of the insulating film on the basis of the obtained distribution of the surface capacitances of the insulating film, the area of the insulating film and the thickness of the insulating film.

5. The measuring apparatus according to claim 3, further comprising a display unit displaying the surface capacitance and the permittivity of the insulating film calculated by the arithmetic unit.

6. A measuring method measuring surface capacitance of an insulating film of a measurement sample structured such that the insulating film is formed on a semiconductor substrate; comprising:

a first step of measuring, by a measuring unit, a current-voltage characteristic, which is dependency on a dc voltage of a current flowing between a probe and the insulating film, when the dc voltage is applied to the semiconductor substrate while a level of the dc voltage being changed at a desired change speed, the dc voltage causing an inversion layer to be formed on an interface between the semiconductor substrate and the insulating film;

a second step of detecting, by an arithmetic unit, a saturation current flowing through the insulating film on the basis of the current-voltage characteristic measured at the first step;

a third step of obtaining, by the arithmetic unit, a relationship between the saturation current flowing through the insulating film and a voltage change speed that is a change speed of the voltage applied to the insulating film on the basis of the saturation current detected at the second step and the voltage change speed; and a fourth step of calculating, by the arithmetic unit, the surface capacitance of the insulating film on the basis of the relationship obtained at the third step, wherein:

the measuring unit performs a measurement process measuring a plurality of the current-voltage characteristics by changing the voltage change speed to a plurality of voltage change speeds at the first step;

the arithmetic unit performs a detection process detecting a plurality of saturation currents on the basis of the measured plurality of current-voltage characteristics at the second step;

the arithmetic unit performs a process plotting a relationship between the plurality of saturation currents and the plurality of current-voltage characteristics to obtain a straight line showing a relationship between the saturation current flowing through the insulating film and the voltage change speed at the third step; and the arithmetic unit performs an arithmetic process calculating a slope of the straight line obtained at the third step as the surface capacitance of the insulating film at the fourth step.

7. The measuring method according to claim 6, wherein:

the measuring unit performs the measurement process at each of a plurality of positions of the insulating film being substantially flat plate-shaped at the first step;

the arithmetic unit performs the detection process at each of the plurality of positions at the second step;

the arithmetic unit performs the process obtaining the straight line at each of the plurality of positions at the third step; and the arithmetic unit performs the arithmetic process at each of the plurality of positions to obtain a distribution of the surface capacitances of the insulating film at the fourth step.

8. A measuring method measuring surface capacitance and permittivity of an insulating film of a measurement sample structured such that the insulating film is formed on a semiconductor substrate; comprising:

a first step of measuring, by a measuring unit, a current-voltage characteristic, which is dependency on a dc voltage of a current flowing between a probe and the insulating film, when the dc voltage is applied to the semiconductor substrate while a level of the dc voltage being changed at a desired change speed, the dc voltage causing an inversion layer to be formed on an interface between the semiconductor substrate and the insulating film;

a second step of detecting, by an arithmetic unit, a saturation current flowing through the insulating film on the basis of the current-voltage characteristic measured at the first step;

a third step of obtaining, by the arithmetic unit, a relationship between the saturation current flowing through the insulating film and a voltage change speed that is a change speed of the voltage applied to the insulating film on the basis of the saturation current detected at the second step and the voltage change speed; and a fourth step of calculating, by the arithmetic unit, the surface capacitance and the permittivity of the insulating film on the basis of the relationship obtained at the third step, wherein:

the measuring unit performs a measurement process measuring a plurality of the current-voltage characteristics by changing the voltage change speed to a plurality of voltage change speeds at the first step;

the arithmetic unit performs a detection process detecting a plurality of saturation currents on the basis of the measured plurality of current-voltage characteristics at the second step;

the arithmetic unit performs a process plotting a relationship between the plurality of saturation currents and the plurality of current-voltage characteristics to obtain a straight line showing a relationship between the saturation current flowing through the insulating film and the voltage change speed at the third step; and the arithmetic unit performs an arithmetic process calculating a slope of the straight line obtained at the third step as the surface capacitance of the insulating film, and calculating permittivity of the insulating film on the basis of the calculated surface capacitance, an area of the insulating film and a thickness of the insulating film, at the fourth step.

9. The measuring method according to claim 8, wherein:
the measuring unit performs the measurement process at each of a plurality of positions of the insulating film being substantially flat plate-shaped at the first step;
the arithmetic unit performs the detection process at each of the plurality of positions at the second step;
the arithmetic unit performs the process obtaining the straight line at each of the plurality of positions at the third step; and
the arithmetic unit performs the arithmetic process at each of the plurality of positions to obtain a distribution of the surface capacitance of the insulating film and a distribution of the permittivity of the insulating film at the fourth step.

10. The measuring method according to claim 8, further comprising a fifth step of displaying the calculated surface capacitance and the calculated permittivity of the insulating film.

* * * * *